United States Patent [19]

Imhauser

[11] Patent Number: 5,376,563
[45] Date of Patent: Dec. 27, 1994

[54] METHOD OF MANUFACTURING AN EMITTER BASE SELF ALIGNMENT STRUCTURE

[75] Inventor: William P. Imhauser, Ambler, Pa.

[73] Assignee: SGS-Thomson Microelectronics, Inc., Carrollton, Tex.

[21] Appl. No.: 210,267

[22] Filed: Mar. 18, 1994

Related U.S. Application Data

[63] Continuation of Ser. No. 983,000, Nov. 30, 1992, abandoned.

[51] Int. Cl.$^5$ .......................................... H01L 21/265
[52] U.S. Cl. ........................................ 437/31; 437/55; 437/36; 148/DIG. 10
[58] Field of Search ................ 437/31, 27, 36, 80, 437/51, 55, 162, 192, 924, 50, 228; 148/DIG. 10, DIG. 102

[56] References Cited

U.S. PATENT DOCUMENTS

| | | | |
|---|---|---|---|
| 4,407,059 | 10/1983 | Sasaki | 437/55 |
| 4,408,388 | 10/1983 | Kameyama | 437/55 |
| 4,433,470 | 2/1984 | Kameyama et al. | 437/55 |
| 4,512,075 | 4/1985 | Vora | 437/55 |
| 4,539,742 | 9/1985 | Kamzaki et al. | 437/55 |
| 4,545,114 | 10/1985 | Ito et al. | 437/31 |
| 4,566,176 | 1/1986 | Moors et al. | 148/DIG. 10 |
| 4,980,304 | 12/1990 | Chin et al. | 437/41 |

*Primary Examiner*—Brian Hearn
*Assistant Examiner*—Tuan Nguyen
*Attorney, Agent, or Firm*—Allan Ratner; Lisa K. Jorgenson; Richard K. Robinson

[57] ABSTRACT

Using a silicon etched technique to remove an implanted base and emitter surrounding emitter-base islands, a "mesa" emitter structure can be formed. Using the structure, a self aligned P+ can be formed around emitter-base islands.

4 Claims, 4 Drawing Sheets

METHOD OF MANUFACTURING AN EMITTER BASE SELF ALIGNMENT STRUCTURE

This application is a continuation of application Ser. No. 07/983,000 filed Nov. 30, 1992, now abandoned.

FIELD OF THE INVENTION

The present invention relates to semiconductor devices, and more particularly, to a method of manufacturing a semiconductor device having automatically aligned structures.

BACKGROUND OF THE INVENTION

It is known in the semiconductor art that figures of merit may be used to describe the performance of a semiconductor device. One figure of merit of particular interest is defined as the numerical ratio between the emitter periphery (EP) and the base area (BA). By increasing the figure of merit, a device demonstrates improved current handling capability. Thus, a device is able to handle high power with low parasitic capacitance. In addition, such a device is highly suitable for high frequency applications (for example, at radio frequencies).

One way of increasing a device's figure of merit is by decreasing the "pitch" or spacing between repetitive patterns, i.e.-emitters. Due to the fact that integrated circuits typically have a planar structure, current that flows from the emitter to the collector typically travels parallel to the surface of the wafer after being transported vertically through the base. This current then flows upward towards a contact located on the wafer surface. Due to the significant resistivity of current-flow paths within the device, parasitic series resistances exist.

One such parasitic resistance is the so-called intrinsic base region (RBB). This resistance is caused by the path length between the base contact and the edge of the injecting emitter region and is related no base sheet resistance. Thus, by decreasing the pitch, or spacing between emitters, the length of the aforementioned path is decreased, resulting in a decreased parasitic resistance in that region.

The base area of a device may be readily decreased using appropriate photolithographic processes. However, current photolithographic processes are unable to produce device features smaller than 1 micron.

Although a reduced base area results in an increased figure of merit, a base area which is too small may lead to poor device performance. In particular, the spacings from base contact to emitter edge are large enough to allow a small amount of depletion so that proper device operation is obtained. Furthermore, of the spacing in selected portions of the device reaches zero, a short may occur, causing the device to become completely inoperative.

As an alternative to varying the distances in the intrinsic base region, some investigators have attempted to reduce the parasitic resistance of this region by selectively adding dopants to this region. This has been done in order to increase this region's conductivity. However, if the intrinsic base is doped too heavily a low emitter-base breakdown voltage may result, since this breakdown is a strong function of the high resistivity side of the junction, in this case, the base.

SUMMARY OF THE INVENTION

A method of manufacturing a semiconductor device comprises the steps of: providing a substrate; providing an insulating layer over a portion of the substrate; introducing a dopant to a further portion of the substrate to form an emitter region; providing a polysilicon layer above the portion of the substrate to form a wafer; providing a plurality of insulating layer portions, each of the portions situated over a respective portion of the polysilicon layer; and etching the wafer to remove portions of the wafer to create a plurality of recesses in the wafer, wherein a portion of each of the insulating portions extends above a portion of a respective one of the plurality of recesses, the plurality of insulating layer portions forming a plurality of windows for P+ implantation.

DETAILED DESCRIPTION

Figure 11:
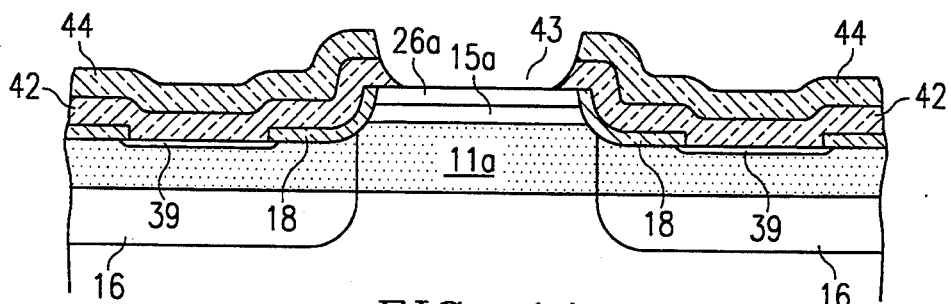
Figure 12:
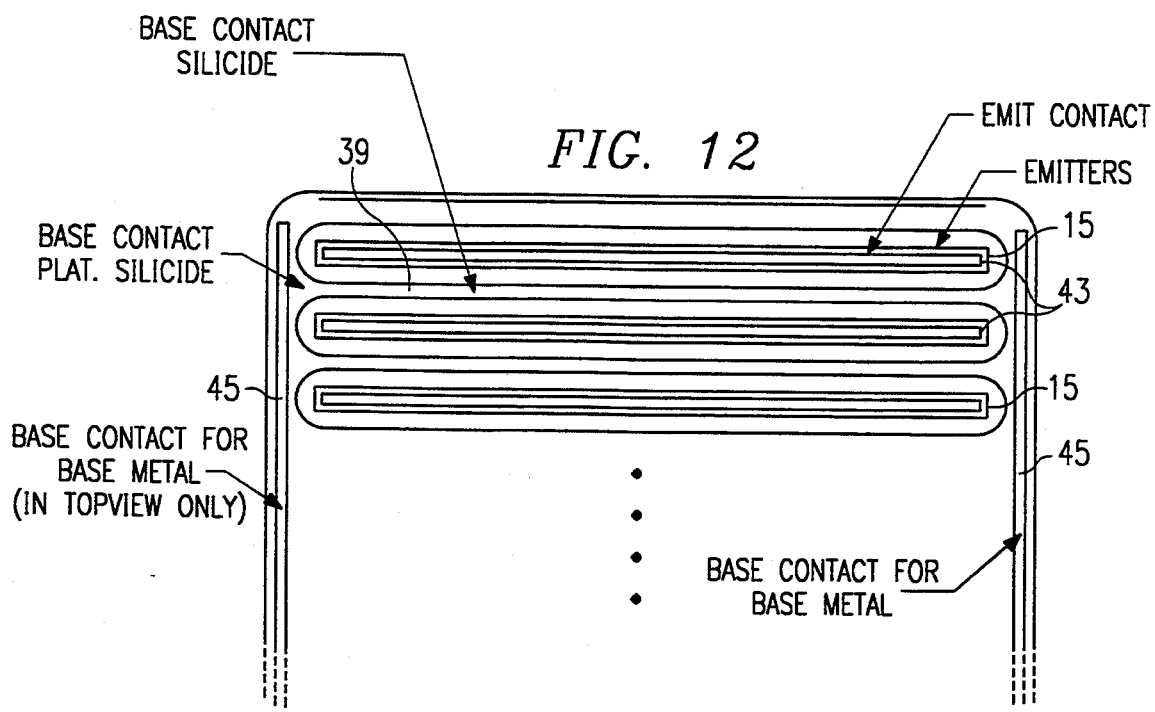
FIG. 12 is a top view of a semiconductor device at the stage of manufacture illustrated by FIG. 11.
Figure 13:
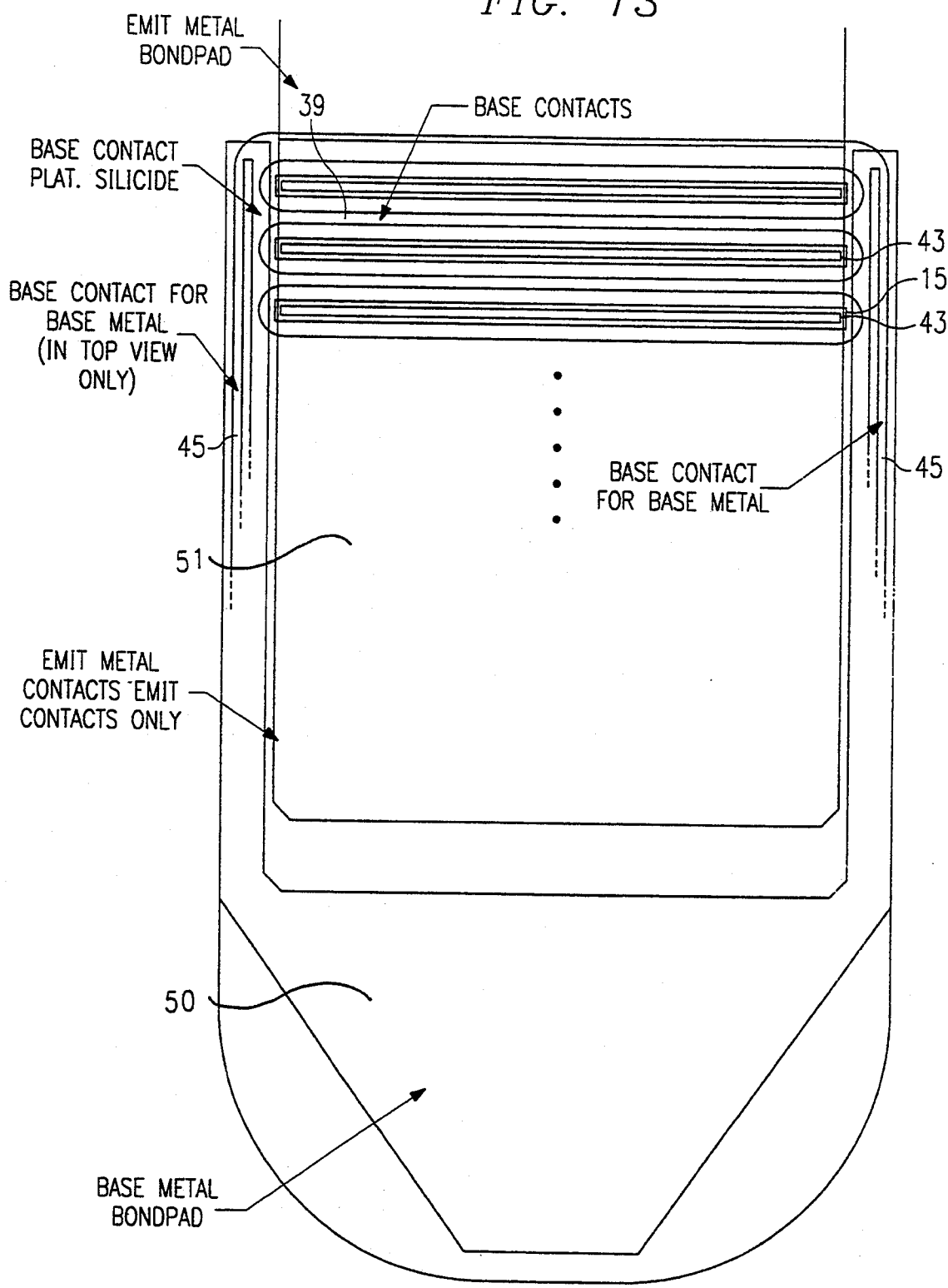
FIG. 13 is a top view of the semiconductor device shown in FIG. 12 after metalization has been applied.

An exemplary embodiment of the present invention will now be described more fully with reference to FIGS. 1-13 in which a semiconductor device is shown during successive stages of manufacture. FIGS. 1-7 show a side view of a relatively large portion of the semiconductor device. FIGS. 8-11 show a relatively close side view of the device, and in particular, provide a detailed view of a portion of the semiconductor device which includes a single emitter. FIG. 12 is a top view of the semiconductor device at the stage of manufacture illustrated by FIG. 11. FIG. 13 shows a top view of the semiconductor device after metalization has been applied. These figures are purely schematic and are not drawn to scale. In particular, the dimensions in the direction of thickness are comparatively strongly exaggerated for the sake of clarity.

A semiconductor device can be manufactured in accordance with an exemplary embodiment of the present invention, in the following manner.

Figure 1:
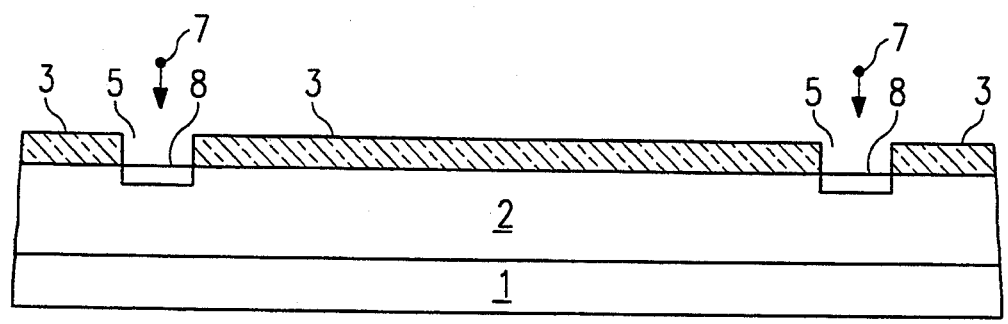
FIGS. 1-11 are cross-sectional views illustrating a process for forming an emitter/base self-alignment structure in accordance with the present invention.

As shown in FIG. 1, the starting material is a semiconductor wafer, in this example of n-type silicon, including n-type epitaxial silicon layer 2 having a thickness of about 5 microns and a resistivity of about 1 OHM cm, which is grown on substrate 1 of highly doped n-type silicon having a resistivity of, for example, 0.002 OHM cm. The epitaxial growth method is known in the art, and is not described. Other thicknesses and/or dopings are possible and will be chosen by those skilled in the art in accordance with existing conditions. Subsequently, an oxide layer 3 is formed on epitaxial layer 2. Oxide layer 3 in this embodiment is a silicon oxide layer having a thickness of, for example, ½ micron which is formed, for example, by thermal oxidation. Openings 5 are then formed in oxide layer 3 by photolithographic etching.

By means of the implantation of boron ions 7 (dose $5 \times 10^{12}$ atoms/cm$^3$ energy 100 keV), P-minus doping 8 is provided. Oxide layer 3 selectively masks against this implantation.

Figure 2:
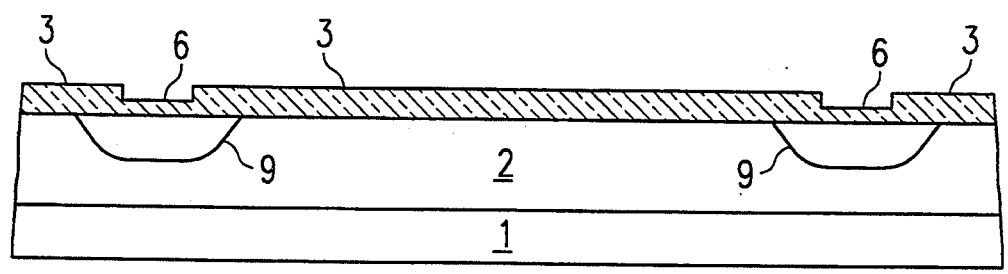

As shown in FIG. 2, breakdown enhancement regions 9 are optionally formed inside epitaxial silicon layer 2 using well known diffusion techniques. In an exemplary embodiment of the present invention, the wafer is placed in a diffusion furnace so as to diffuse the low conductivity P− diffusion region into the wafer. This diffusion step is preferably performed in a nitrogen and an oxygen environment. During the diffusion step, an oxide coating 6 is formed in previously exposed openings 5.

Figure 3:
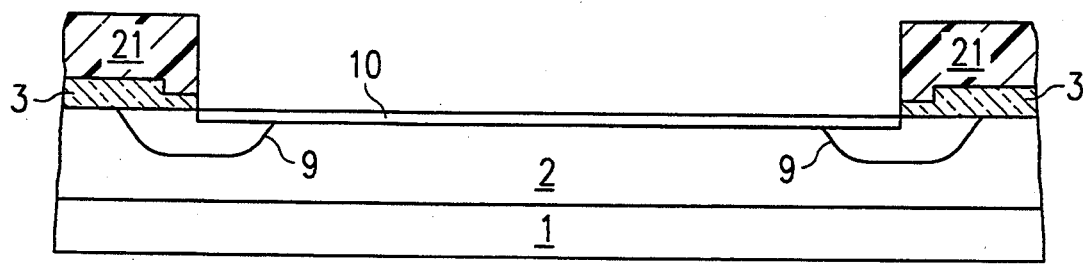

As shown in FIG. 3, photoresist 21 is applied to portions of the wafer. The wafer is then subjected to an etching ambient, causing the exposed portions of oxide layer 3 and oxide coating 6 to be removed. The wafer is then subjected to a P implant, such as boron, 6E13 atom/cm$^2$, 25 KeV to form base implant region 10. This is followed by a short drive cycle (performed, for example, in N$_2$ gas at 900°) to form base implant region 11.

Figure 4:
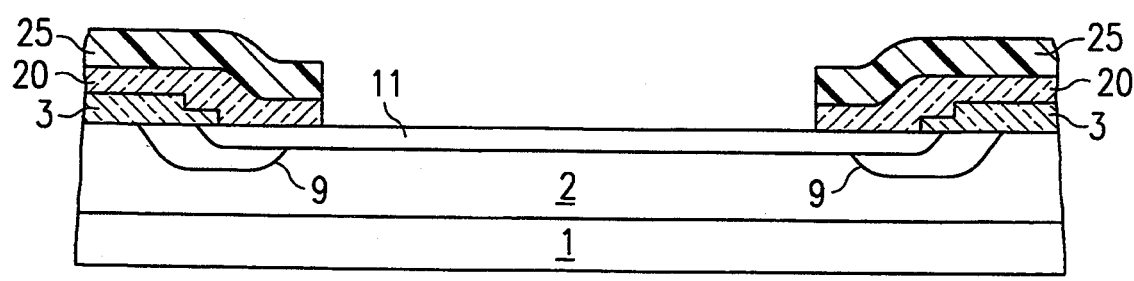

As shown in FIG. 4, photoresist 21 is removed and another oxide layer 20 is deposited by low temperature (350°–400° C.) glass deposition. Oxide layer 20 is preferably formed with a thickness ranging from 1500 to 2500 Å. Photoresist mask medium 25 is then applied to the wafer and the entire wafer is again subjected to an etching ambient, causing the exposed portions of oxide layer 20 to be removed.

Figure 5:
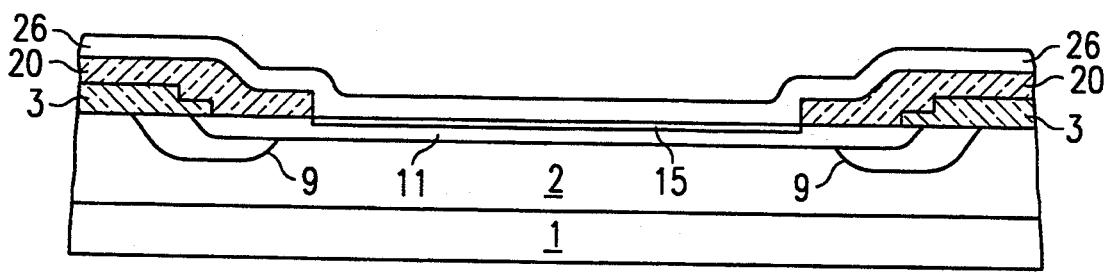

Next, the wafer is treated with an N+ implant (e.g. arsenic) to form emitter region 15. Then, as shown in FIG. 5, polysilicon layer 26 is deposited. Polysilicon layer 26 may be deposited using a method such as for example, low pressure chemical vapor deposition (LPCVD).

Figure 6:
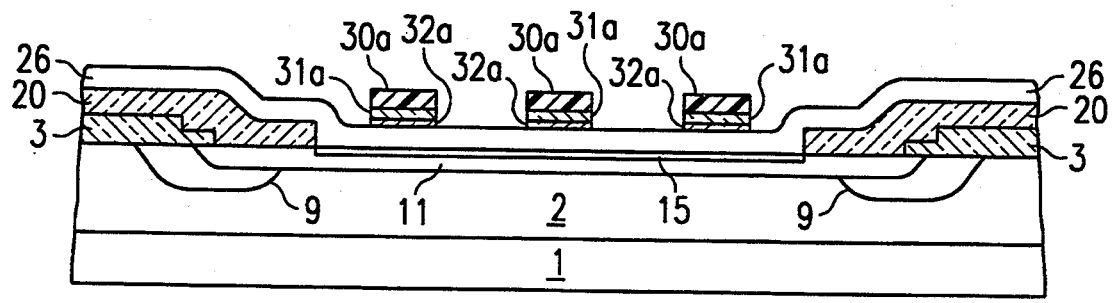

Nitride layer 32 (not shown) and oxide layer 31 (not shown) are then deposited onto the wafer. Photoresist 30a through 30z is then placed upon the oxide coating 31 at appropriate positions. Using an etching ambient, portions of oxide layer 31 and nitride layer 32 which have not been covered by photoresist 30a through 30z are removed. In this manner, as illustrated by FIG. 6, oxide 31a through 31z and nitride 32a through 32z remain.

After photoresist 30a through 30z is removed, the wafer is subjected to dry isotropic etching in this manner, portions of polysilicon layer 26, emitter region 15 and part of the base implant region 11 are removed. Because the etching is isotropic, oxide portions 31a through 31z and nitride portions 32a through 32z extend beyond the remaining portions of polysilicon layer 26 and emitter region 15. Thus, oxide portions 31a through 31z and nitride portions 32a through 32z form a plurality of "overhanging shelves". These shelves define a plurality of windows through which ion implantation may occur. The inventor has found that the dimensions of these shelves can be tightly controlled by using an appropriate etchant. In an exemplary embodiment of the present invention, this etchant is a gas mixture comprising tetrafluoromethane (CF$_4$) halocarbon 13b1 and oxygen (O$_2$) in ratios of approximately 90:5:5 percent (by weight).

Furthermore, in an exemplary embodiment of the present invention, this etch is accomplished with a Tegal 700 etcher. Using the aforementioned gas mixture, a two-part vertical for one-part lateral etch ratio is obtained. It is extremely desirable to obtain this type of "sloped" edge to maintain good step coverage for later metalization.

Figure 7:
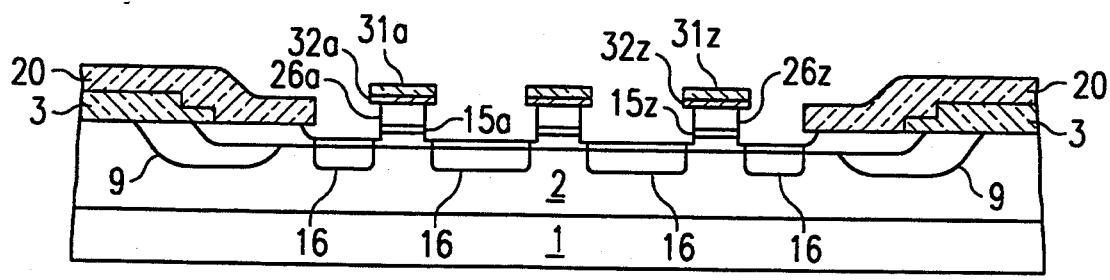

After completing the etching step, as shown in FIG. 7, a P+ implant 16 is provided. The P+ implantation energy is desirably chosen to allow am least partial penetration of the overhanging shelves formed by oxide portions 31a through 31z and nitride portions 32a through 32z.

Figure 8:
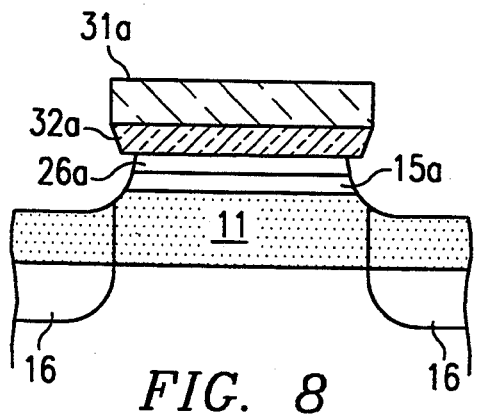

FIG. 8 is a close-up view of a portion of the semiconductor device shown at the stage of manufacturing which is illustrated by FIG. 7.

Figure 9:
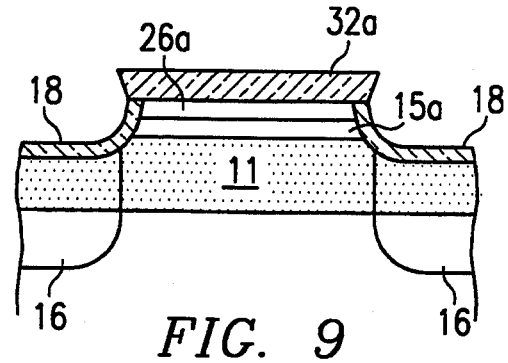

As shown in FIG. 9, oxide portions 31a through 31z are removed. Then, oxide layer 18 is deposited. Oxide layer 18 may have a thickness of 1000 Å. Oxide layer 18 may be deposited by high pressure oxidation at low temperature.

Figure 10:
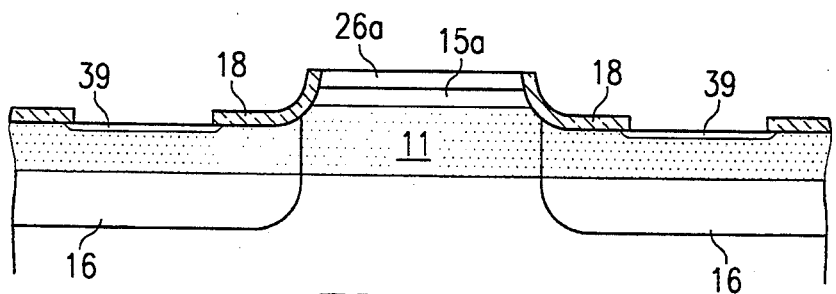

Next, as shown in FIG. 10, silicided contacts 39 are formed after nitride portions 32a through 32z are removed. Then, as shown in FIG. 11, layer 42 (low temperature nitride) and layer 44 (low temperature oxide) are deposited and defined as per FIG. 11 (of which FIG. 12 is a top view). Next, as shown in FIG. 13, base metal 50 and emitter metal 51 are each deposited in an appropriate configuration.

By forming a semiconductor device in this manner, the various structures within this device can be carefully aligned. Thus, the intrinsic base region can be formed with a length of approximately 1000 angstroms, thus resulting in a 40% increase in the maximum frequency capabilities over prior art devices. In addition, the figure of merit of a device formed using the above described method can be as high as 15. This results in an additional 40% increase in maximum frequency capabilities over prior art devices. These increases in frequency capabilities may result in a doubling of gain in the device. This results in a half-octave-improvement in frequency capability (i.e. increasing maximum frequency of operation from 4 GHZ to 6 GHZ for silicon technology).

In addition, because of the self alignment features, improved injection uniformity is achieved.

Furthermore, the processing steps of the present invention are significantly simplified over that of many prior art devices, thus reducing the number of photoresist, process and high temperature steps.

While the invention has been described in terms of an exemplary embodiment, it is contemplated that it may be practiced as outlined above with modifications within the spirit and scope of the appended claims.

What is claimed is:

1. A method of manufacturing a semiconductor device, said method comprising the steps of:
   a) providing a substrate;
   b) providing an insulating layer over a portion of said substrate;
   c) introducing a dopant to a further portion of said substrate to form an emitter layer;
   d) providing a polysilicon layer above said portion of said substrate to form a wafer;
   e) providing a plurality of insulating layer portions, each of said portions situated over a respective portion of said polysilicon layer;
   f) isotopically etching said wafer to remove portions of said emitter layer so as to form a plurality of emitter regions and to remove portions of said wafer to create a respective undercut in each one of said plurality of insulating layer portions and to create a plurality of recesses in said wafer, wherein a portion of each of said insulating layer portions extends above a portion of a respective one of said plurality of recesses, said plurality of insulating layer portions forming a plurality of windows for P+ implantation.

g) introducing a further dopant exclusively through said plurality of windows to form a plurality of P+ regions which are separated from and not in direct contact with any of said plurality of emitter regions, each of said P+ regions positionally corresponding to a respective one of said plurality of windows.

2. A method of claim 1 wherein in step f) said etching step is performed using a gas mixture.

3. The method of claim 1, further comprising the steps of removing each of said insulating layer portions.

4. The method of claim 3, further comprising the step of forming one of a plurality of contacts above each one of said plurality of P+ regions.

* * * * *